(12) United States Patent
Ma et al.

(10) Patent No.: US 11,219,143 B2
(45) Date of Patent: Jan. 4, 2022

(54) CONTROL UNIT OF DISPLAY DEVICE AND DISPLAY DEVICE

(71) Applicant: BOE TECHNOLOGY GROUP CO., LTD., Beijing (CN)

(72) Inventors: Yongda Ma, Beijing (CN); Pan Li, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 962 days.

(21) Appl. No.: 15/761,172

(22) PCT Filed: Aug. 31, 2017

(86) PCT No.: PCT/CN2017/099885
§ 371 (c)(1),
(2) Date: Mar. 19, 2018

(87) PCT Pub. No.: WO2018/141153
PCT Pub. Date: Aug. 9, 2018

(65) Prior Publication Data
US 2019/0269047 A1 Aug. 29, 2019

(30) Foreign Application Priority Data
Feb. 6, 2017 (CN) .......................... 201720109966.8

(51) Int. Cl.
*H05K 1/00* (2006.01)
*H05K 1/18* (2006.01)
(Continued)

(52) U.S. Cl.
CPC ............. *H05K 9/0054* (2013.01); *G09G 3/20* (2013.01); *H05K 7/20* (2013.01); *G09G 2300/04* (2013.01)

(58) Field of Classification Search
CPC ...... H05K 9/0054; H05K 7/20; H05K 9/0022; G09G 3/20; G09G 2300/04
See application file for complete search history.

(56) References Cited

U.S. PATENT DOCUMENTS 5,396,397 A * 3/1995 McClanahan ....... H01L 23/5383
257/E23.114
5,818,060 A * 10/1998 Kimura .................. B64G 1/546
250/515.1

(Continued)

FOREIGN PATENT DOCUMENTS

CN 102045994 A 5/2011
CN 102122090 A 7/2011
(Continued)

OTHER PUBLICATIONS

International Search Report dated Dec. 8, 2017.

*Primary Examiner* — Yuriy Semenenko
(74) *Attorney, Agent, or Firm* — Dilworth & Barrese, LLP.; Michael J. Musella, Esq.

(57) ABSTRACT

The present disclosure provides a control unit of display device and a display device. The control unit of display device includes: a back plate a plurality of circuit structures, the plurality of circuit structures being arranged on the back plate; a plurality of electric field shielding structures, each of the electric field shielding structures being arranged between the circuit structures and configured to shield an electric field between the circuit structures, wherein each of the electric field shielding structures includes a plurality of shielding strips, the plurality of shielding strips are spaced apart from each other and projections of the shielding strips on a corresponding side of the circuit structure are continuous and uninterrupted.

18 Claims, 3 Drawing Sheets

(51) Int. Cl.
  *H05K 7/00*    (2006.01)
  *H05K 9/00*    (2006.01)
  *G09G 3/20*    (2006.01)
  *H05K 7/20*    (2006.01)

(56) References Cited

U.S. PATENT DOCUMENTS

| | | | |
|---|---|---|---|
| 6,028,577 | A * | 2/2000 | Sakamoto ............ G09G 3/3648 345/92 |
| 2006/0098417 | A1 | 5/2006 | Yuan et al. |
| 2006/0269263 | A1* | 11/2006 | Kim ..................... G02B 27/646 396/55 |
| 2009/0122021 | A1* | 5/2009 | Liu ..................... G02F 1/13338 345/173 |
| 2011/0090624 | A1 | 4/2011 | Kim et al. |
| 2014/0048914 | A1* | 2/2014 | Lin ........................ H01L 24/19 257/659 |
| 2016/0295713 | A1* | 10/2016 | Hwang ................... H05K 5/03 |
| 2017/0179039 | A1* | 6/2017 | Lee ..................... H01L 23/3157 |
| 2018/0096956 | A1* | 4/2018 | Li ........................... H01L 27/12 |
| 2019/0025633 | A1* | 1/2019 | Lv ..................... G02F 1/133512 |

FOREIGN PATENT DOCUMENTS

| | | |
|---|---|---|
| CN | 206451500 U | 8/2017 |
| WO | 2005093694 A1 | 6/2005 |

\* cited by examiner

A-A'

CONTROL UNIT OF DISPLAY DEVICE AND DISPLAY DEVICE

TECHNICAL FIELD

The present disclosure relates to a control unit of display device and a display device.

BACKGROUND

A plurality of circuit structures are arranged in a control unit of display device. In order to prevent interference of electric field and electromagnetic wave being generated between different circuit structures, the circuit structures are generally shielded to prevent it from being influenced by the outside environment. In the prior art, the electric field is generally shielded by a metal casing, but in this way, the heat generated by the circuit structures cannot be dissipated well while the electric field is completely shielded, therefore reducing the heat dissipating effect of the control unit and shortening the lifetime of the control unit.

SUMMARY

The present disclosure provides a control unit of display device and a display device, which can solve at least one of the technical problems existing in the prior art and can improve the heat dissipating effect without affecting the shielding effect of the electric field.

In one aspect, an embodiment of the present disclosure provides a control unit of display device, the control unit of display device comprises: a back plate; a plurality of circuit structures, the plurality of circuit structures being arranged on the back plate; a plurality of electric field shielding structures, each of the plurality of electric field shielding structures being arranged between the circuit structures and configured to shield an electric field between the circuit structures, wherein each of the plurality of electric field shielding structures comprises a plurality of shielding strips, the plurality of shielding strips are spaced apart from each other and projections of the shielding strips on a corresponding side of the circuit structure are continuous and uninterrupted.

For example, the circuit structure is in a shape of rectangular, the plurality of electric field shielding structures comprise first shielding structures and second shielding structures, the first shielding structures are arranged on two opposite sides of the circuit structure, and the second shielding structures are arranged on other two sides of the circuit structure; each of the first shielding structure comprises at least two first shielding strips that are spaced apart from each other, a size of each of the first shielding strips in an arrangement direction of the second shielding structures is smaller than a size of the circuit structure in the arrangement direction of the second shielding structures, and a projection of each of the first shielding structures on a corresponding side of the circuit structure is continuous and uninterrupted.

For example, in an identical first shielding structure of the first shielding structures, projections of every two adjacent first shielding strips of the first shielding strips on the corresponding side of the circuit structure are in contact with each other and without any overlap.

For example, an angle between an extending direction of at least one of the first shielding strips and a predetermined heat dissipating direction ranges from 45° to 90°.

For example, an angle between the extending direction of each of the first shielding strips and the predetermined heat dissipating direction ranges from 45° to 90°.

For example, a size of the first shielding structure in the arrangement direction of the second shielding structures is not smaller than the size of the circuit structure in the arrangement direction of the second shielding structures; or a size of the second shielding structure in a predetermined heat dissipating direction is not smaller than a size of the circuit structure in the predetermined heat dissipating direction.

For example, a size of the first shielding structure in the arrangement direction of the second shielding structures is not smaller than the size of the circuit structure in the arrangement direction of the second shielding structures; and a size of the second shielding structure in a predetermined heat dissipating direction is not smaller than a size of the circuit structure in the predetermined heat dissipating direction.

For example, the circuit structure comprises a circuit board that is arranged on the back plate and an electronic component that is arranged on the circuit board, and a signal terminal is arranged on an edge of the circuit board that is close to at least one of the second shielding structures; the second shielding structure corresponding to the edge where the signal terminal is arranged comprises at least two second shielding strips that are spaced apart from each other and a projection of the second shielding structure on a corresponding side of the circuit structure is discrete at a position of the signal terminal, and the electric field shielding structure further comprises an electric field shielding casing that is enveloped outside the signal terminal.

For example, the signal terminal is arranged on an edge of the circuit board that is close to one of the second shielding structures; in another one of the second shielding structures, a number of the second shielding strips is at least two and the second shielding strips are spaced apart from each other, a size of the second shielding strip in the predetermined heat dissipating direction is smaller than a size of the circuit structure in the predetermined heat dissipating direction, and the projection of the second shielding structure on the circuit structure is continuous and uninterrupted.

For example, the second shielding strip extends along the predetermined heat dissipating direction.

For example, the first shielding strip and the second shielding strip are metal strips that are formed integrally with the back plate; or, the first shielding strip or the second shielding strip is a metal strip that is formed integrally with the back plate.

For example, the first shielding strip comprises a filling block and a conductive layer enveloping the filling block; and/or, the second shielding strip comprises a filling block and a conductive layer enveloping the filling block.

For example, the conductive layer is a conductive adhesive tape.

For example, the circuit structure comprises a circuit board that is arranged on the back plate, an electronic component and a signal terminal that are arranged on the circuit board, in any two adjacent circuit structures, under a condition that a height of a first circuit structure is less than a height of a second circuit structure, a height of a shielding strip between the first circuit structure and the second circuit structure is not less than $(H3*L1+H1(L-L1))/L$; wherein $H1$ is a height of a first reference electronic component in the first circuit structure; $H3$ is a height of a second reference electronic component in the second circuit structure; $L1$ is a distance between a side of the first reference electronic component that is farthest from the shielding strip between the first circuit structure and the second circuit structure and a side of the shielding strip between the first circuit structure and the second circuit structure that is closest to the first reference electronic element; L is a distance between a side of the first reference electronic component that is farthest from the second reference electronic component and a side of the second reference electronic component that is farthest from the first reference electronic component; the second reference electronic component is an electronic component with a highest height in the second circuit structure; the first reference electronic component is an electronic component with a smallest angle between a connection line of a top of the electronic component in the first circuit structure and a top of the second reference electronic component and the back plate; the height of the shielding strip is a distance between a top of the shielding strip and an upper surface of the back plate at a corresponding position to the shielding strip; the height of the electronic component is a distance between a top of the electronic component and an upper surface of the back plate at a corresponding position to the electronic component; and the height of the circuit structure is a height of an electronic component with a highest height in the circuit structure.

For example, in a same first shielding structure, projections of every two adjacent first shielding strips on the corresponding side of the circuit structure overlap with each other.

For example, in a same second shielding structure, projections of every two adjacent second shielding strips on the corresponding side of the circuit structure overlap with each other.

For example, in a same second shielding structure, projections of every two adjacent second shielding strips on the corresponding side of the circuit structure are in contact with each other and without any overlap.

Correspondingly, an embodiment of the present disclosure further provides a display device, the display device comprises the above control unit of display device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1:
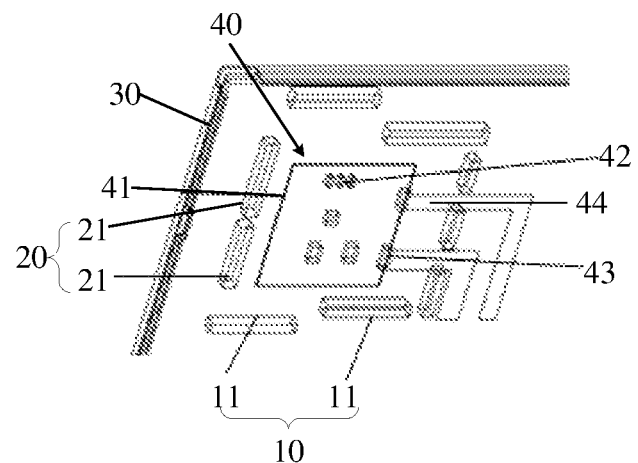
FIG. 1 is a partial perspective view of a control unit of display device in an embodiment of the present disclosure.

Wherein the reference numbers are:

10—first shielding structure; 11—first shielding strip; 20—second shielding structure; 21—second shielding strip; 30—back plate; 40—circuit structure; 41—circuit board; 42—electronic component; 43—signal terminal; 44—signal line; 45—electric field shielding casing.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The technical solutions in the embodiments of the present disclosure are clearly and completely described below with reference to the accompanying drawings in the embodiments of the present disclosure, obviously, the described embodiments are merely a part but not all of the embodiments of the present disclosure.

In an aspect of the present disclosure, a control unit of display device is provided, the control unit of display device comprises: a back plate; a plurality of circuit structures, the plurality of circuit structures are arranged on the back plate; a plurality of electric field shielding structures, each of the electric field shielding structures being arranged between the circuit structures and configured to shield an electric field between the circuit structures, wherein each of the electric field shielding structures comprises a plurality of shielding strips, the plurality of shielding strips are spaced apart from each other and projections of the shielding strips on a corresponding side of the circuit structures are continuous and uninterrupted.

An exemplary description is given below with reference to FIG. 1 to FIG. 4. the control unit of display device comprises a back plate 30, a plurality of circuit structures 40 and an electric field shielding structure that is used for shielding an electric field for each of the circuit structures 40 are arranged on the back plate 30; the electric field shielding structure comprises a plurality of shielding strips that surrounds the circuit structure 40. The plurality of shielding strips comprise a plurality of first shielding strips 11 that are arranged on two opposite sides of the circuit structure 40 and a plurality of second shielding strips 21 that are arranged on other two sides of the circuit structure 40; the first shielding strips 11 that are arranged on the same side of the circuit structure 40 constitute a first shielding structure 10, the second shielding strips 21 that are arranged on the same side of the circuit structure 40 constitute a second shielding structure 20, two first shielding structures 10 are arranged in a predetermined heat dissipating direction of the circuit structure 40. The first shielding structure 10 comprises at least two first shielding strips 11 that are spaced apart from each other, a size of each of the first shielding strips in an arrangement direction of the two second shielding structures 20 is smaller than a size of the circuit structure 40 in the arrangement direction of the two second shielding structures 20, and a projection of the first shielding structure 10 on a corresponding side of the circuit structure 40 is continuous and uninterrupted.

It should be noted that the projection being continuous and uninterrupted means that there is no gap between any adjacent projections of the projections of all the shielding strips in the shielding structure. For example, the projection edges between the adjacent shielding strips are seamlessly connected or the projections overlap with each other.

The control unit of display device is particularly suitable for a vertical display device. The heat generated during the operation of the circuit structure 40 mainly dissipates in a vertical direction, therefore the predetermined heat dissipating direction refers to an up-down direction when the control unit of display device is used in the vertical display device. In the present disclosure, the predetermined heat dissipating direction is the up-down direction in FIG. 2 and FIG. 4.

Figure 2:
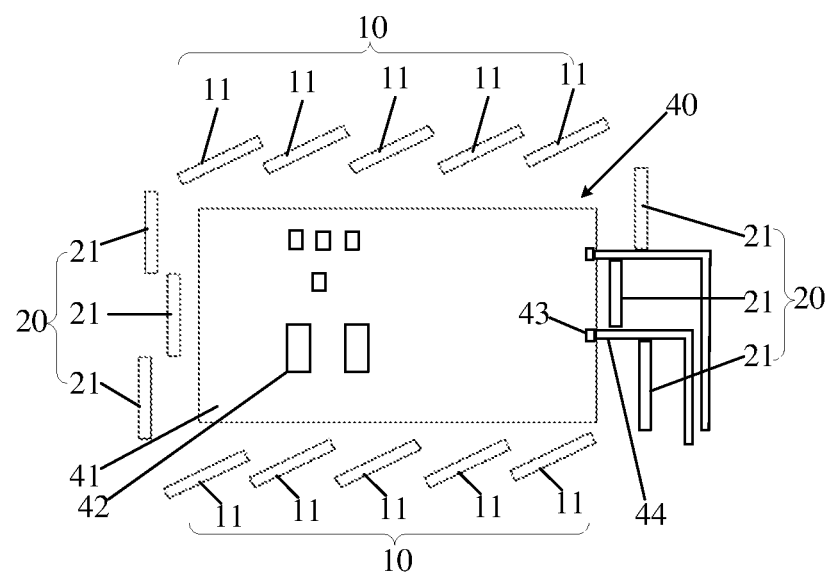
FIG. 2 is a top view of a circuit structure and an electric field shielding structure in a first structure in a control unit of display device in an embodiment of the present disclosure.
Figure 4:
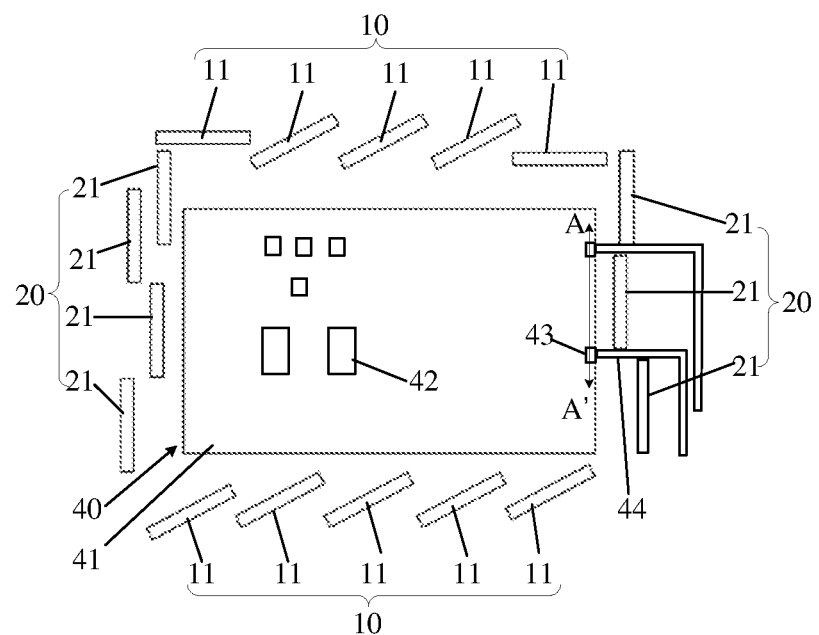
FIG. 4 is a top view of a circuit structure and an electric field shielding structure in a second structure in a control unit of display device in an embodiment of the present disclosure.

In FIG. 2 and FIG. 4, the two second shielding structures 20 are arranged in a left-right direction. Therefore, the size of the first shielding strip 11 in the arrangement direction of the two second shielding structures 20 is a length of a projection of the first shielding strip 11 on the circuit structure 40 in the left-right direction.

In the present disclosure, the two first shielding structures 10 are arranged in the predetermined heat dissipating direction (namely a main direction of the heat dissipation), the first shielding strips 11 of the first shielding structure 10 are spaced apart from each other, and the size of the first shielding strip 11 in the arrangement direction of the two second shielding structures 20 is smaller than the size of the circuit structure 40 in the arrangement direction of the two second shielding structures 20, therefore when most of the heat generated by the circuit structure 40 dissipates in the predetermined heat dissipating direction, the heat can dissipate outwardly via an interval between the two adjacent first shielding strips 11 to improve the heat dissipating effect. Moreover, the projection of the first shielding structure 10 on the corresponding side of the circuit structure 40 is continuous and uninterrupted, and an electromagnetic wave propagates in a straight line direction, therefore an interval between the first shielding strips 11 does not affect the shielding effect of the electric field, so as to improve the heat dissipating effect of the control unit of display device without affecting the electric field shielding effect and prolong the service life of the control unit of the display device.

Herein in order to improve the shielding effect, the size of the first shielding structure 10 in the arrangement direction of the two second shielding structures 20 is not smaller than the size of the circuit structure 40 in the arrangement direction of the two second shielding structures 20; and/or, a size of the second shielding structure 20 in the predetermined heat dissipating direction is not smaller than a size of the circuit structure 40 in the predetermined heat dissipating direction.

In the present disclosure, in order to realize that the projection of the first shielding structure 10 on the circuit structure 40 is continuous and uninterrupted, the projections of every two adjacent first shielding strips 11 on the circuit structure 40 may partially overlap with each other or only contact but not overlap with each other. In order to further facilitate the heat to dissipate outwardly, for example, as illustrated in FIG. 2 and FIG. 4, in the same first shielding structure 10, the projections of every two adjacent first shielding strips 11 on the corresponding side of the circuit structure 40 are in contact with each other and without any overlap, that is, two ends of two adjacent first shielding strips 11 that are close to each other are flush in the predetermined heat dissipating direction.

Figure 3:
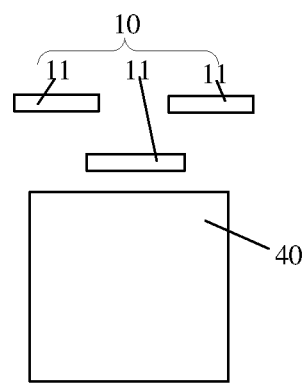
FIG. 3 is a positional relationship schematic diagram of a circuit structure and a first shielding structure on one side of the circuit structure.

It should be noted that "two adjacent first shielding strips 11" in the present disclosure means that a distance between the two first shielding strips 11 in the arrangement direction of the two second shielding structures 20 are the smallest. For example, an arrangement of the first shielding strips 11 in one of the first shielding structures 10 is illustrated in FIG. 3, the two second shielding structures (not illustrated in FIG. 3) are still arranged in the left-right direction. In this situation, the first shielding strip 11 that is adjacent to a leftmost first shielding strip 11 is a middle first shielding strip 11 instead of a rightmost shielding strip 11.

In the present disclosure, an extending direction of the first shielding strip 11 is not particularly limited. For example, the extending direction of the first shielding strip 11 may be perpendicular to the predetermined heat dissipating direction (as illustrated in FIG. 1) or may intersect with but not be perpendicular to the predetermined heat dissipating direction. For example, as illustrated in FIG. 2 and FIG. 4, an angle between the extending direction of at least one of the first shielding strips 11 and the predetermined heat dissipating direction ranges from 45° to 90°. Further, for example, an angle between the extending direction of each of the first shielding strips 11 and the predetermined heat dissipating direction ranges from 45° to 90°. Compared with the arrangement in FIG. 1 (that is, the extending direction of each of the first shielding strips 11 is perpendicular to the predetermined heat dissipating direction), the angle between the extending direction of the first shielding strip 11 and the predetermined heat dissipating direction being set to range from 45° to 90° are more favorable to dissipate heat.

Structures of the circuit structure 40 and the second shielding structure 20 are described below with reference to FIG. 1 to FIG. 4. The circuit structure 40 comprises a circuit board 41 that is arranged on the back plate 30 and an electronic component 42 that is arranged on the circuit board 41, a signal terminal 43 is arranged on an edge of the circuit board 41 that is close to at least one second shield structure 20. The signal terminal 43 is used to connect with other circuit structures 40 or a signal terminal through a signal line 44.

Figure 5:
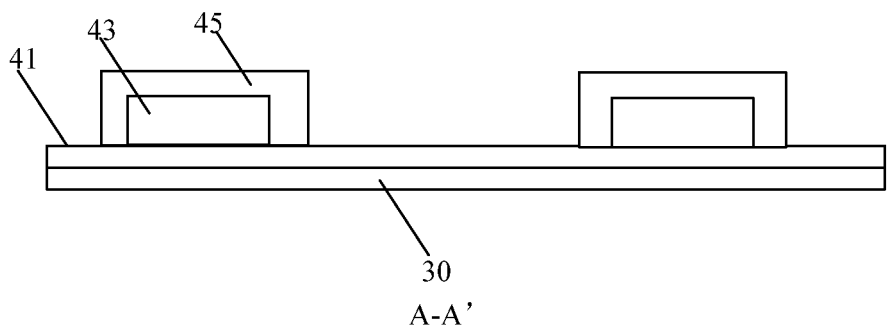
FIG. 5 is a sectional view taken along a line A-A' of FIG. 4.

The second shielding structure 20 (the second shielding structure 20 on a right side of the circuit structure 40 in FIG. 2 and FIG. 4) corresponding to the edge where the signal terminal 43 is arranged comprises at least two second shielding strips 21 that are spaced apart from each other, projections of the second shielding strips 21 on the corresponding side of the circuit structure 40 is discrete at a position of the signal terminal 43, and the electric field shielding structure further comprises an electric field shielding casing 45 (as illustrated in FIG. 5) that is enveloped outside the signal terminal 43. Therefore, the signal line 44 may be led out from the interval between the second shielding strips 21 on the right side, and the electric field shielding casing 45 that is enveloped outside the signal terminal 43 can prevent electric field interference that is caused by the interval between the second shielding strips 21 on the right side. In order to facilitate every signal line 44 to being lead out, the number of the intervals that are formed by the projections of the second shielding structures 20 corresponding to the edge where the signal terminal 43 is arranged on the circuit structure 40 may be the same as the number of the signal terminals 43. For example, in FIG. 2 and FIG. 4, two signal terminals 43 are arranged on an edge of the circuit board 41 facing the right second shield structure 20. In this situation, the second shield structure 20 may comprise three second shield strips 21 that are spaced apart from each other. The interval between every two adjacent second shielding strips 21 corresponds to one signal terminal 43. Herein a height of the electric field shielding casing 45 may be greater than a height of the electronic component 42 on the circuit board 41 to improve the shielding effect.

Further, the signal terminal 43 is arranged on an edge of a circuit board 41 that is close to one of the second shield structures 20 (the right second shield structure 20 in FIG. 2 and FIG. 4), and at an edge of the circuit board 41 that is close to another second shield structure 20 (the left second shield structure 20 in FIG. 2 and FIG. 4), no signal terminal 43 is arranged. In this situation, in the another second shielding structure 20 (the left second shielding structure 20 in FIG. 2 and FIG. 4), the number of the second shielding strips 21 is at least two and the two second shielding strips 21 are spaced from each other, the size of the second shielding strip 21 in the predetermined heat dissipating direction is smaller than the size of the circuit structure 40 in the predetermined heat dissipating direction and the projection of the second shielding structure 20 on the corresponding side of the circuit structure 40 is uninterrupted. Therefore, when the heat of the circuit structure 40 dissipates in the left-right direction, the heat can also dissipate out from an interval between the left second shielding strips 21 to further improve the heat dissipating effect. There is an interval between two adjacent second shielding strips 21 on the left side, but there is no interval between projections of the two adjacent second shielding strips 21 on the circuit structure 40. Therefore, the interval between the second shielding strips 21 can further improve the heat dissipation without affecting the shielding of the electric field.

Herein in the left second shield structure 20, projections of two adjacent second shield strips 21 on the circuit structure 40 may not overlap with each other or may partially overlap with each other. In each of the second shielding structures 20, each of the second shielding strips 21 may extend in the predetermined heat dissipating direction.

Material and structure of the shielding strip in the present disclosure may be set as follows:

A first manner is: the first shielding strip 11 and/or the second shielding strip 21 are metal strips that are formed integrally with the back plate 30. A second manner is: the first shielding strip 11 and/or the second shielding strip 21 respectively comprise a filling block and a conductive layer enveloping the filling block. The filling block may be in a foam-like or a sponge-like structure, and the conductive layer may be a conductive adhesive tape.

That is, both the first shielding strip 11 and the second shielding strip 21 may be metal strips that are formed integrally with the back plate 30; alternatively, both the first shielding strip 11 and the second shielding strip 21 may respectively comprise a filling block and a conductive layer enveloping the filling block. Alternatively, one of the first shielding strip 11 and the second shielding strips 21 is a metal strip that is formed integrally with the back plate 30, the other one comprises a filling block and a conductive layer enveloping the filling block.

Figure 6:
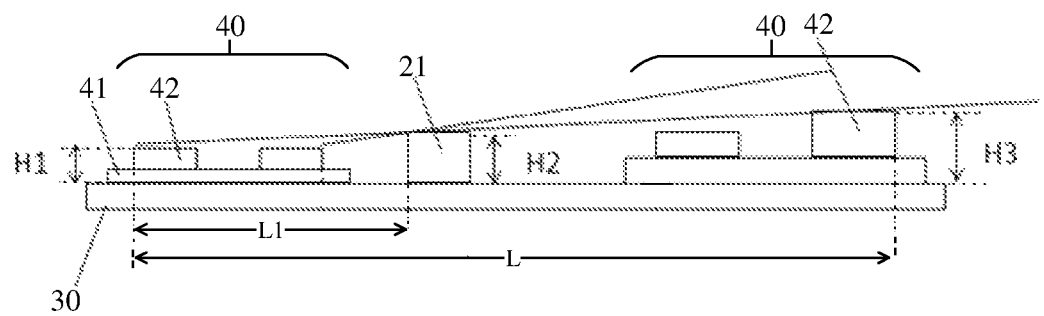
FIG. 6 is a schematic diagram of two adjacent circuit structures and a shielding strip between the two adjacent circuit structures.

In order to ensure that the shielding strip between the two adjacent circuit structures 40 can shield the electric field, a height of the shielding strip cannot be too small. The height of the shielding strip between the two circuit structures 40 should not be less than a maximum height of an electronic component 42 on the circuit structure 40 with a relative small height, a height of an electronic component 42 is a distance between a top of the electronic component 42 and an upper surface of the back plate 30 at a corresponding position to the electronic component. Further, as illustrated in FIG. 6, in any two adjacent circuit structures 40, when a height of a first circuit structure 40 is less than a height of a second circuit structure 40 (the height of a circuit structure 40 is a height of an electronic component with a highest height in the circuit structure 40), a height of a shielding strip between the two circuit structures 40 is H2, the height H2 is a distance between a top of the shielding strip and an upper surface of the back plate 30 at a corresponding position to the shielding strip; H2 satisfies:

$$H2 \geq (H3*L1 + H1(L-L1))/L;$$

In the above formula, H1 is a height of a first reference electronic component in the first circuit structure 40 (namely the circuit structure 40 at a left side in FIG. 6), the height is a distance between a top of the first reference electronic component and an upper surface of the back plate 30 at a position corresponding to the first reference electronic component; H3 is a height of a second reference electronic component in the second circuit structure 40 (namely the right circuit structure 40 in the FIG. 6), the height is a distance between a top of the second reference electronic component and an upper surface of the back plate 30 at a corresponding position to the second reference electronic component; L1 is a distance between a side of the first reference electronic component that is farthest from the shielding strip between the two circuit structures 40 and a side of the shielding strip between the two circuit structures 40 that is closest to the first reference electronic element; L is a distance between a side of the first reference electronic component that is farthest from the second reference electronic component and a side of the second reference electronic component that is farthest from the first reference electronic component. Wherein the second reference electronic component is an electronic component 42 with a highest height in the second circuit structure 40; the first reference electronic component is an electronic component 42 with a smallest angle between a connection line of a top of the electronic component 42 in the first circuit structure 40 and a top of the second reference electronic component and the back plate 30. In FIG. 6, the shielding strip between the two circuit structures 40 is shown as the second shielding strip 21 to illustrate. Of course, the shielding strip between the two circuit structures 40 may also be the first shielding strip 11.

Above is a description of the control unit of display device provided by the present disclosure. It can be seen that in the electric field shielding structure that is used for shielding the circuit structure 40, the first shielding strips 11 of the first shielding structure 10 are spaced apart from each other, and the size of the first the shielding strip 11 in the arrangement direction of the two second shielding structures 20 is smaller than the size of the circuit structure 40 in the arrangement direction of the two second shielding structures 20, therefore when most of the heat that is generated by the circuit structure 40 dissipates in a predetermined heat dissipating direction, the heat can dissipate outwardly via the interval between the two adjacent first shielding strips 11 to improve the heat dissipating effect. Moreover, the electromagnetic wave propagates in a straight line direction, the projection of the first shielding structure 10 on the corresponding side of the circuit structure 40 is continuous and uninterrupted, therefore the interval between the first shielding strips 11 does not affect the shielding effect of the electric field so as to improve the heat dissipating effect of the control unit of the display device without affecting the shielding effect of the electric field. In addition, the second shielding structure 20 comprises at least two second shielding strips 21 that are spaced apart from each other, the signal terminal 43 on the circuit board 41 is enveloped by the electric field shielding casing 45, and therefore the signal interference caused by the interval between the second shielding strips 21 can be avoided. The projection of the second shielding structure 20 corresponding to the edge where the signal terminal 43 is not arranged on the circuit structure 40 is continuous so as to further improve the heat dissipating effect without affecting the shielding effect of the electric field.

As a second aspect of the present disclosure, a display device is provided, the display device comprises the above control unit of the display device. Wherein the display device may be a vertical display device. In the electric field shielding structure of the control unit of display device in the present disclosure, the interval between the shielding strips does not affect the shielding effect of the electric field while increases the heat dissipating effect, and therefore prolongs the lifetime of the control unit of display device, and the display device adopting the control unit of display device can achieve better heat dissipation and better quality.

The present disclosure provides a control unit of display device and a display device. The two first shielding structures are arranged in the predetermined heat dissipation direction, the first shielding strips of the first shielding structure are spaced apart from each other, and the size of the first shielding strip in the arrangement direction of the two second shielding structures is smaller than the size of the circuit structure in the arrangement direction of the two second shielding structures, so that when most of the heat that is generated by the circuit structure dissipates in the predetermined heat dissipating direction, the heat can dissipate outwardly via the interval between the two adjacent first shielding strips to improve the heat dissipating effect. Moreover, the projection of the first shielding structure on the circuit structure is continuous and uninterrupted, and the electromagnetic wave propagates in a straight line direction, therefore the interval between the first shielding strips does not affect the shielding effect of the electric field so as to improve the heat dissipating effect of the control unit of display device without affecting the shielding effect of the electric field, and therefore prolong the lifetime of the control unit of display device and the lifetime of a display panel adopting the control unit of display device.

Obviously, those skilled in the art can make various modifications and variations to the present disclosure without departing from the spirit and scope of the disclosure. In this situation, if these modifications and variations of the present disclosure fall within the scope of the claims and their equivalent technologies of the present disclosure, the present disclosure is also intended to comprise these modifications and variations.

The present application claims priority to the Chinese patent application No. 201720109966.8 filed Feb. 6, 2017, the entire disclosure of which is incorporated herein by reference as part of the present application.

What is claimed is:

1. A control unit of a display device, comprising:
   a back plate,
   a plurality of circuit structures, the plurality of circuit structures being arranged on the back plate,
   a plurality of electric field shielding structures, each of the plurality of electric field shielding structures being arranged between the circuit structures and configured to shield an electric field between the circuit structures,
   wherein each of the plurality of electric field shielding structures comprises a plurality of shielding strips, the plurality of shielding strips are spaced apart from each other and projections of the shielding strips on a corresponding side of the circuit structure are continuous and uninterrupted,
   wherein each of the plurality of circuit structure is in a shape of rectangular, the plurality of electric field shielding structures comprise first shielding structures and second shielding structures, the first shielding structures are arranged on two opposite sides of the circuit structure, and the second shielding structures are arranged on other two sides of the circuit structure,
   each of the first shielding structure comprises at least two first shielding strips that are spaced apart from each other,
   each of the second shielding structure comprises at least two second shielding strips that are spaced apart from each other,
   wherein the first shielding strip comprises a filling block and a conductive layer enveloping the filling block; and/or, the second shielding strip comprises a filling block and a conductive layer enveloping the filling block.

2. The control unit of the display device according to claim 1, wherein
   a size of each of the first shielding strips in an arrangement direction of the second shielding structures is smaller than a size of the circuit structure in the arrangement direction of the second shielding structures, and a projection of each of the first shielding structures on a corresponding side of the circuit structure is continuous and uninterrupted.

3. The control unit of the display device according to claim 2, wherein in an identical first shielding structure of the first shielding structures, projections of every two adjacent first shielding strips of the first shielding strips on the corresponding side of the circuit structure are in contact with each other and without any overlap.

4. The control unit of the display device according to claim 2, wherein an angle between an extending direction of at least one of the first shielding strips and a predetermined heat dissipating direction ranges from 45° to 90°, wherein when the control unit of display device is used in a vertical display device, the predetermined heat dissipating direction is an up-down direction.

5. The control unit of the display device according to claim 4, wherein an angle between the extending direction of each of the first shielding strips and the predetermined heat dissipating direction ranges from 45° to 90°.

6. The control unit of the display device according to claim 2, wherein a size of the first shielding structure in the arrangement direction of the second shielding structures is not smaller than the size of the circuit structure in the arrangement direction of the second shielding structures; or
a size of the second shielding structure in a predetermined heat dissipating direction is not smaller than a size of the circuit structure in the predetermined heat dissipating direction.

7. The control unit of the display device according to claim 2, wherein the circuit structure comprises a circuit board that is arranged on the back plate and an electronic component that is arranged on the circuit board, and a signal terminal is arranged on an edge of the circuit board that is close to at least one of the second shielding structures;
the second shielding structure corresponding to the edge where the signal terminal is arranged comprises at least two second shielding strips that are spaced apart from each other and a projection of the second shielding structure on a corresponding side of the circuit structure is discrete at a position of the signal terminal, and the electric field shielding structure further comprises an electric field shielding casing that is enveloped outside the signal terminal.

8. The control unit of the display device according to claim 7, wherein the signal terminal is arranged on an edge of the circuit board that is close to one of the second shielding structures;
in another one of the second shielding structures, a number of the second shielding strips is at least two and the second shielding strips are spaced apart from each other, a size of the second shielding strip in the predetermined heat dissipating direction is smaller than a size of the circuit structure in the predetermined heat dissipating direction, and the projection of the second shielding structure on the circuit structure is continuous and uninterrupted.

9. The control unit of the display device according to claim 2, wherein the second shielding strip extends along the predetermined heat dissipating direction.

10. The control unit of the display device according to claim 2, wherein the first shielding strip and the second shielding strip are metal strips that are formed integrally with the back plate; or,
the first shielding strip or the second shielding strip is a metal strip that is formed integrally with the back plate.

11. The control unit of the display device according to claim 1, wherein the conductive layer is a conductive adhesive tape.

12. The control unit of the display device according to claim 1, wherein the circuit structure comprises a circuit board that is arranged on the back plate, an electronic component and a signal terminal that are arranged on the circuit board,
in any two adjacent circuit structures, under a condition that a height of a first circuit structure is less than a height of a second circuit structure, a height of a shielding strip between the first circuit structure and the second circuit structure is not less than $(H3*L1+H1(L-L1))/L$;
wherein $H1$ is a height of a first reference electronic component in the first circuit structure;
$H3$ is a height of a second reference electronic component in the second circuit structure;
$L1$ is a distance between a side of the first reference electronic component that is farthest from the shielding strip between the first circuit structure and the second circuit structure and a side of the shielding strip between the first circuit structure and the second circuit structure that is closest to the first reference electronic element;
$L$ is a distance between a side of the first reference electronic component that is farthest from the second reference electronic component and a side of the second reference electronic component that is farthest from the first reference electronic component;
the second reference electronic component is an electronic component with a highest height in the second circuit structure; the first reference electronic component is an electronic component with a smallest angle between a connection line of a top of the electronic component in the first circuit structure and a top of the second reference electronic component and the back plate; the height of the shielding strip is a distance between a top of the shielding strip and an upper surface of the back plate at a corresponding position to the shielding strip; the height of the electronic component is a distance between a top of the electronic component and an upper surface of the back plate at a corresponding position to the electronic component; and the height of the circuit structure is a height of an electronic component with a highest height in the circuit structure.

13. The control unit of the display device according to claim 2, wherein in a same first shielding structure, projections of every two adjacent first shielding strips on the corresponding side of the circuit structure overlap with each other.

14. The control unit of the display device according to claim 2, wherein in a same second shielding structure, projections of every two adjacent second shielding strips on the corresponding side of the circuit structure overlap with each other.

15. The control unit of the display device according to claim 2, wherein in a same second shielding structure, projections of every two adjacent second shielding strips on the corresponding side of the circuit structure are in contact with each other and without any overlap.

16. A display device, comprising the control unit of the display device according to claim 1.

17. The control unit of the display device according to claim 3, wherein the circuit structure comprises a circuit board that is arranged on the back plate and an electronic component that is arranged on the circuit board, and a signal terminal is arranged on an edge of the circuit board that is close to at least one of the second shielding structures;
the second shielding structure corresponding to the edge where the signal terminal is arranged comprises at least two second shielding strips that are spaced apart from each other and a projection of the second shielding structure on a corresponding side of the circuit structure is discrete at a position of the signal terminal, and the electric field shielding structure further comprises an electric field shielding casing that is enveloped outside the signal terminal.

18. The control unit of the display device according to claim 4, wherein the circuit structure comprises a circuit board that is arranged on the back plate and an electronic component that is arranged on the circuit board, and a signal terminal is arranged on an edge of the circuit board that is close to at least one of the second shielding structures;
the second shielding structure corresponding to the edge where the signal terminal is arranged comprises at least two second shielding strips that are spaced apart from each other and a projection of the second shielding structure on a corresponding side of the circuit structure is discrete at a position of the signal terminal, and the electric field shielding structure further comprises an electric field shielding casing that is enveloped outside the signal terminal.

* * * * *